United States Patent
Arena-Foster et al.

(10) Patent No.: US 6,730,605 B2
(45) Date of Patent: May 4, 2004

(54) REDISTRIBUTION OF COPPER DEPOSITED FILMS

(75) Inventors: Chantal Arena-Foster, Mesa, AZ (US); Robert F. Foster, Mesa, AZ (US); Joseph T. Hillman, Scottsdale, AZ (US); Thomas J. Licata, Mesa, AZ (US); Tugrul Yasar, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 487 days.

(21) Appl. No.: 09/833,879

(22) Filed: Apr. 12, 2001

(65) Prior Publication Data

US 2002/0148720 A1 Oct. 17, 2002

(51) Int. Cl.$^7$ .................. C23C 16/00; C23C 14/32; H01L 21/311
(52) U.S. Cl. ................ 438/696; 438/694; 438/695; 438/703; 438/745; 438/747; 438/754; 438/607; 216/90; 216/91; 216/92; 216/99; 216/100; 216/105; 216/106; 427/96; 427/250; 427/252; 427/229; 204/192.3; 204/192.32; 204/192.35
(58) Field of Search .................. 204/192.3, 192.32, 204/192.35; 427/96, 250, 252, 229; 134/2, 3; 216/90, 91, 92, 99, 100, 105, 106; 438/695, 694, 696, 703, 745, 747, 754, 687

(56) References Cited

U.S. PATENT DOCUMENTS

| | | | |
|---|---|---|---|
| 5,178,739 A | 1/1993 | Barnes et al. | 204/192.12 |
| 5,569,363 A | 10/1996 | Bayer et al. | 204/192.32 |
| 5,861,344 A * | 1/1999 | Roberts et al. | 438/738 |
| 6,037,001 A * | 3/2000 | Kaloyeros et al. | 427/250 |
| 6,281,589 B1 * | 8/2001 | Nguyen et al. | 257/774 |
| 6,413,864 B1 * | 7/2002 | Pyo | 438/687 |
| 6,488,984 B1 * | 12/2002 | Wada et al. | 427/229 |

FOREIGN PATENT DOCUMENTS

JP     2000-138190    *   5/2000

OTHER PUBLICATIONS

Computer translation of Japan 2000–138190.*

* cited by examiner

*Primary Examiner*—Rodney G. McDonald
(74) *Attorney, Agent, or Firm*—Wood, Herron & Evans, LLP

(57) ABSTRACT

A method to redistribute solid copper deposited by PVD on a wafer topography. The deposited copper is solubilized in a fluid for redistribution. The copper redistribution prevents inherent nonuniformity of the deposited copper film thickness by improving the uniformity of thickness of the copper film on the covered surfaces, such as vertical and bottom surfaces. The method provides the advantages of good adhesion and good grain growth and orientation that are achieved with copper deposited by PVD, and also provides the good step coverage as achieved with copper deposited by CVD.

43 Claims, 1 Drawing Sheet

REDISTRIBUTION OF COPPER DEPOSITED FILMS

FIELD OF THE INVENTION

The invention relates generally to methods of physical vapor deposition of copper onto a substrate.

BACKGROUND

In the formation of integrated circuits (IC), thin films containing metal and metalloid elements are deposited upon the surface of a semiconductor substrate or wafer. The films provide conductive and ohmic contacts in the circuits and between the various devices of an IC. For example, a thin film of a desired metal might be applied to the exposed surface of a contact or via in a semiconductor substrate. The film, passing through the insulative layers of the substrate, provides plugs of conductive material for the purpose of making interconnections across the insulating layers.

One well known process for depositing a thin metal film is by chemical vapor deposition (CVD). In CVD, reactant or deposition gas precursors are pumped One well known process for depositing a thin metal film is by chemical vapor deposition (CVD). In CVD, reactant or deposition gas precursors are pumped into proximity to a target and substrate inside a reaction chamber. The precursors are activated using either thermal energy or electrical energy, and subsequently undergo chemical reactions at the surface of the target and substrate. This results in one or more reaction by-products, which are deposited on the exposed substrate or wafer surface to form a film.

CVD of copper provides the desirable property of high step coverage of the substrate, that is, a high ratio of the coating thickness at the bottom of a feature such as a trench or via, relative to the thickness of the coating on the top surface of the substrate adjacent the feature. CVD of copper, however, suffers from several difficulties and limitations. Adhesion of films deposited by CVD on most substrates utilized for copper technologies is difficult because most copper precursors do not sufficiently nucleate. As a result, nucleation is uneven as well as spotty, leading to poor non-conformal film growth with poor grain size and orientation control. Deposition of copper with most precursors is also difficult to control because of the poor stability of the precursor sources as well as the frequent early decomposition of the precursor in the delivery device.

It has been shown that copper deposited by CVD using a hexafluoroacetylacetonate (hfac) type of copper precursor results in conformal film growth over topography with about 100% step coverage. On the other hand, it is also known that in most cases deposition is gas feed limited, which usually results in very poor conformality due to depletion of the precursor in the trench or via. These factors suggest that somehow the hfac type of precursor and other copper precursors have a unique ability to uniformly coat the topography of a device, regardless of what precursor concentrations or partial pressure exists.

Physical vapor deposition (PVD), whereby electrical energy creates a vapor of particles to deposit onto a substrate, provides several desirable properties when copper is deposited. Copper deposited by PVD onto commonly used substrates shows very good adhesion, and good grain size and orientation, which are key to reliable copper metallization schemes. However, PVD of copper has the disadvantage that, while PVD can be highly directional with generous amounts of copper on the top and bottom horizontal surfaces, there is relatively little copper deposited on the vertical wall surface of a feature, such as a trench or via.

A PVD method for depositing copper onto a substrate is desirable. Such a method will provide the good adhesion and good grain size and orientation advantages of PVD.

SUMMARY OF THE INVENTION

The invention is directed to a method to redistribute solid copper deposited by PVD on a wafer topography, to result in enhanced uniform coverage of copper. To this end, and in accordance with the principles of the present invention, the deposited copper is solubilized in a fluid under solubilizing-promoting conditions in the reaction chamber, transported and redeposited. These steps may be performed for as many times as necessary to achieve redistribution. The solubilizing fluid may be a gas or a liquid. The method may further include supplying an electric field to the wafer. Copper may be redeposited by changing the temperature and/or the pressure in the reaction chamber.

The invention is further directed to a method of redistributing copper deposited on a wafer surface having a topography. At least a part of the surface copper is volatilized. A concentration of the volatilized copper is maintained to diffuse into the topography for redeposition. Volatilizing may be obtained by flowing an etching agent above the wafer. The concentration of the removed copper may be maintained high by a copper plate positioned adjacent the wafer, and the temperature of the plate and chamber may be higher than the temperature of the wafer.

The invention improves the uniformity of thickness of the resulting copper film. These and other objects and advantages of the present invention shall be made apparent from the accompanying description and examples thereof.

DETAILED DESCRIPTION

A method is disclosed to redistribute copper that has been unevenly deposited onto a substrate by any PVD method or any low step coverage deposition method. In the method of the present invention, copper is redistributed from the substrate surfaces where it is in excess to the surfaces where it is lacking, particularly in recesses such as on the vertical walls of vias and trenches.

Figure 1:
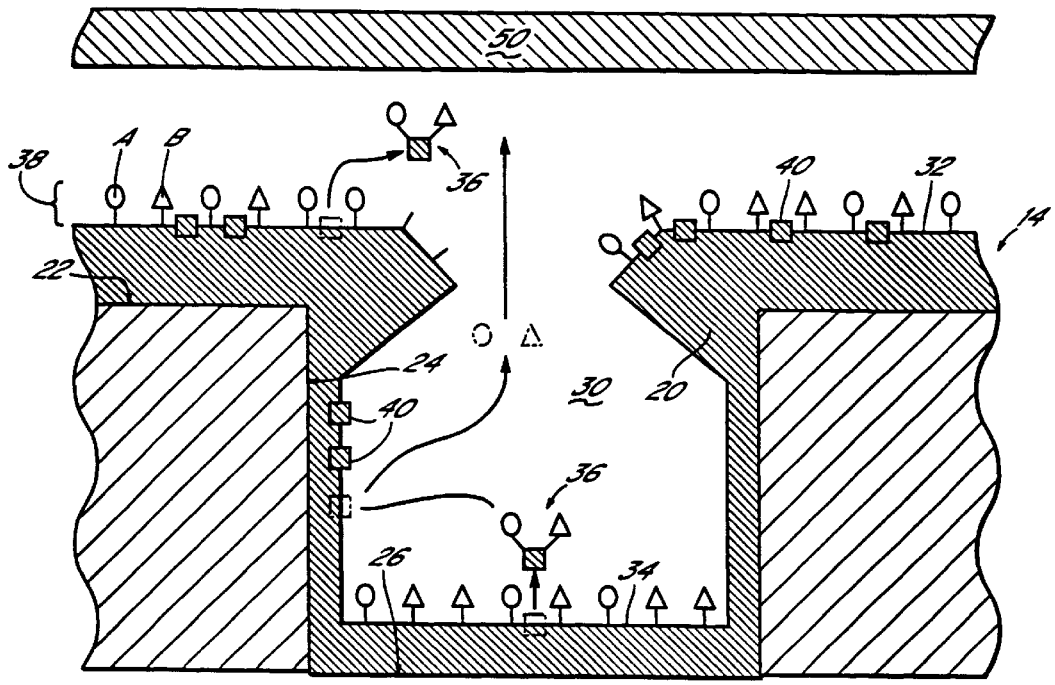
FIG. 1 is a schematic of deposited copper in a feature before redistribution and during redistribution.

With reference to the wafer 14 of FIG. 1, solid copper 20 is deposited on substrate surfaces 22, 24, 26 by standard physical vapor deposition (PVD) methods, such as ionized physical vapor deposition (iPVD), or by any low step coverage deposition method. In the case of PVD, electrical energy creates a vapor of particles that are deposited onto substrate surfaces 22, 24, 26. In iPVD, sputtered particles are passed through a dense plasma before deposition onto the substrate surfaces 22, 24, 26. The dense plasma, containing positively charged ions coupled with an electric field or bias, attracts the particles so that they have a better chance of reaching the bottom surface 26 of a via 30 or other feature, such as a high aspect ratio feature, by a negative force or potential difference.

A method of depositing thin metal films on substrates, such as semiconductor wafers, by iPVD has been described.

For example, U.S. Pat. Nos. 5,569,363 and 5,178,739 each describe an iPVD system which may be used in the present invention to achieve high metal ionizations. The result is deposition of copper 20 onto the surfaces 22, 24, 26 of a wafer 14 but in a non-uniform manner, as depicted in FIG. 1. While adequate or even generous amounts of copper 20 are deposited on horizontal surfaces 22, 26 of the topography, relatively little copper 20 is deposited on vertical surfaces 24, such as the wall of a via 30. For ease of discussion, deposition will be said to occur by PVD methods, but it is to be understood that included therewith is any now known or hereafter developed low step coverage deposition method.

With further reference to FIG. 1, the wafer 14 containing solid copper 20 deposited by iPVD, for example, is submitted to a mixture of gases, such as Hhfac plus chlorine or oxygen and trimethylvinylsilane (tmvs), that will allow volatile copper compounds, such as $Cu(hfac)_2$ or Cu(hfac) tmvs, to form. It should be understood by those skilled in the art that other weak Lewis-base ligands may be substituted for tmvs without departing from the scope of the present invention. In FIG. 1, copper ligands A and B selectively adsorb onto copper surfaces 32 and 34 where the copper deposits are thicker. The exposure of wafer 14 to the gases occurs under conditions of operation such as low temperature, up to about 300° C., and high pressure, about 1–500 torr, that will allow migration of copper hfac or other molecules 36 away from the wafer 14 surface. Nevertheless, at the proper temperature and pressure in the reaction chamber, a thin film 38 of highly mobile copper hfac molecules 36 likely forms at the surface, allowing for redistribution of copper 40 by surface diffusion.

Figure 2:
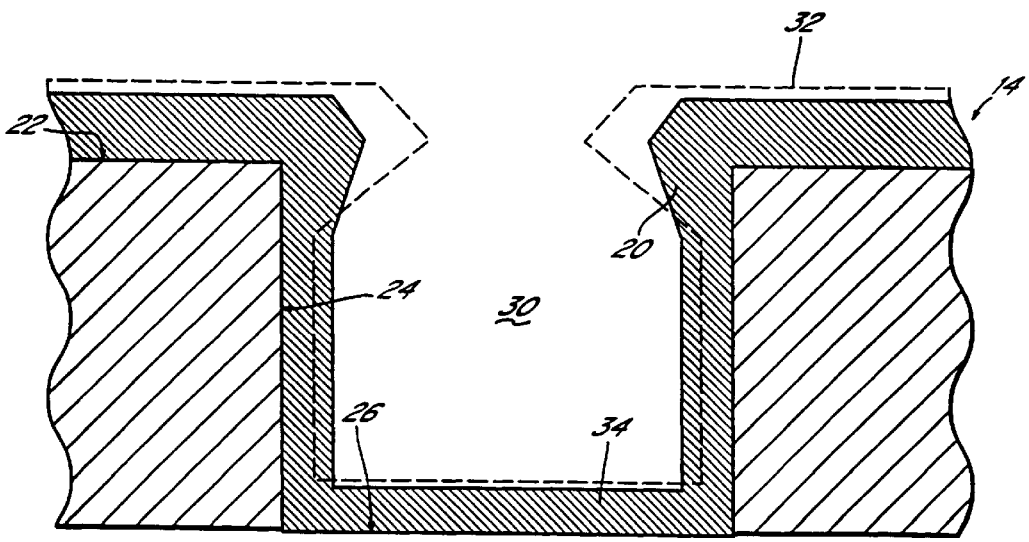
FIG. 2 is a schematic of deposited copper after redistribution.

With further reference to FIG. 1, the thin film 38 of highly mobile copper hfac molecules 36 on the surfaces 32, 34 of the wafer 14 may be redistributed through fluids, such as liquids or gases. In one embodiment, the gas phase transportation of desorbed and readsorbed copper 40 is used, which takes advantage of the intrinsic trapping effect of molecules 36 in vias or trenches 30 by position to the rapidly flushed top horizontal surface 32. Thus, in this embodiment, gaseous vectors transport copper 40 to other locations on the wafer 14 where copper was depleted or inadequately deposited, yielding a more uniform distribution of copper 20 on the substrate topography as depicted in FIG. 2.

The thin film 38 of highly mobile copper hfac molecules 36 may also be redistributed by a liquid vector. The liquid dissolves the copper, and the resultant pseudo-liquid film flows into vias and trenches 30 driven by either gravity or surface tension mechanisms, and tends to fill the vias and trenches 30.

Once the copper hfac molecules 36 are thought to have reached the desired location of the wafer 14 topography, operation conditions are changed to provoke the redeposition of solid copper 40 and evacuation of the hfac or other type of gaseous byproducts. For example, temperature, pressure, or other reaction conditions may be changed to provoke the following reaction:

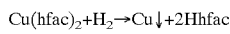

$$Cu(hfac)_2 + H_2 \rightarrow Cu\downarrow + 2Hhfac$$

Conditions of operation such as low temperature and high pressure are chosen to avoid migration of copper hfac molecules 36 or other precursor molecules away from the wafer 14 surface 32. For instance, it could be recommended to operate the reaction chamber at 150° C. and 100 torr, which is the vapor pressure of $Cu(hfac)_2$ at 150° C. Nevertheless, at the proper temperature and pressure, a thin film 38 of highly mobile copper hfac molecules 36 will form at the surfaces 32, 34 of the copper, allowing for redistribution of copper 40 by surface diffusion. It is expected to see at least some of the top excess copper be transported along the side of a contact structure.

The net result is copper redistribution, as shown in FIG. 2, with a minimum loss of the copper 20 previously deposited by PVD. Redistribution of about 10%–20% of copper 20 deposited by PVD is generally sufficient. The copper 40 redistributed by the method of the present invention has the proper grain size and orientation provided by the PVD underlayer, i.e. a strong [111] orientation with micron-range sized grains, and also has improved step coverage associated with a copper film deposited by CVD. Moreover, the benefit of the excellent adhesion of the PVD copper film is advantageously exploited and nucleation difficulties of copper vapor precursors are less of a problem by the method of the invention.

EXAMPLE 1

Using liquid redistribution of copper, a solution of hfac and tmvs is dispensed onto a spinning wafer having a PVD-deposited Cu film thereon to evenly distribute the liquid across the surface. It should be understood by one skilled in the art that the optimum rate of spinning for even distribution will vary depending on the viscosity of the solution. The wafer is kept at a temperature at which dissolution of copper is very limited, around room temperature. The liquid fills the topography of the wafer and forms a thin film on the top surface of the wafer. At this point, the wafer is brought to a higher temperature, for example about 60° C., where the copper or the oxidized part of the copper reacts and dissolves in the solution, forming an in-situ copper-containing solution. Assuming that the copper molecules get redistributed uniformly in the solution, there will be a uniform supply of copper at any location of the topography. Then, the temperature to which the wafer is exposed is increased, for example to about 100–300° C., and the pressure is decreased, for example to lower than about 10 torr, to allow the copper molecules to decompose and result in even copper redeposition. The procedure may be repeated as many times as required to obtain the desired copper redistribution, preferentially in vias and trenches.

EXAMPLE 2

The same liquid solution containing copper molecules as described in Example 1 is used but is prepared ex-situ, such as spin-on metal solutions, which are well known to those of ordinary skill in the art. The solution is then dispensed onto a wafer, either with or without copper already deposited on the wafer, and the wafer is spun to obtain a homogenous liquid film on the surface. Subsequent treatments, such as temperature and pressure adjustment as described in Example 1, would allow for the copper to deposit from the solution and would allow the byproduct to be evacuated by evaporation of the solvent. Also, where copper is already deposited on the wafer, dissolution of copper into the ex-situ copper-containing solution may be invoked to increase the copper content in the liquid film.

EXAMPLE 3

The method of Example 1 or Example 2 is used with an electrical field added on the wafer. Copper deposition from the liquid solution is electro-assisted, as in electroplating, which is well known to those skilled in the art and, per se, forms no part of the present invention.

EXAMPLE 4

A two step process may be used, whereby copper is first deposited by PVD and then the copper is partially chemically etched, as described in reaction (1+):

$$Cu°+Cu^{2+}(hfac)_2+2(tmvs) \rightarrow 2Cu(hfac)(tmvs) \qquad (1+)$$

By way of example, reaction (1+) is carried out at a temperature of about room temperature to about 300° C. and a pressure of about 0.5 torr to about 500 torr. The etched material is then used as a deposition precursor by reversing reaction (1+) by stopping the flow of $Cu(hfac)_2$ and tmvs, and copper is redeposited in a uniform fashion across the surface of the wafer according to reaction (1−):

$$2Cu(hfac)(tmvs) \rightarrow Cu°+Cu^{2+}(hfac)_2+2(tmvs) \qquad (1-)$$

By way of example, reaction (1−) is carried out at a temperature of about 100° C. to about 300° C. and a pressure of about 0.1 torr to about 10 torr.

The etching process (1+) is carried out in depletion so that relatively little of the $Cu^{2+}$ $(hfac)_2$ reaches the sidewalls and bottom of the features, and mainly most $Cu^{2-}$ $(hfac)_2$ reacts with the top surface material. Following the etching step, the system is placed into deposition mode by turning off the tmvs and/or the $Cu(hfac)_2$ thus stopping the (1+) etching reaction, but allowing for the produced Cu(hfac)(tmvs) to disproportionate according to the reaction (1−) that leads to the deposition of copper. In order to increase the residence time of Cu(hfac)(tmvs), which will in turn increase the deposition probability, the pumping of the gases will be slowed down or stopped.

EXAMPLE 5

An alternative chemistry for the etching reaction described in Example 4 is as follows:

$$Cu_2O+2Hhfac \rightarrow 2Cu^{2+}(hfac)_2+H_2O \qquad (2)$$

The copper surface is first exposed to a low partial pressure of oxygen, for example of a few torr at about 100–200° C. for a few seconds, to oxidize only the top surface of the copper film and the copper overhang that typically forms at the top corners of the features. Hhfac is then introduced to etch the copper oxide, for example under conditions similar to the chemical reaction (1+) described in Example 4. Following the etching step, hydrogen is introduced into the reaction chamber to allow copper deposition to occur via hydrogen reduction of $2Cu^{2+}$ $(hfac)_2$, according to the reaction:

$$2Cu^{2+}(hfac)_2+H_2 \rightarrow 2Cu°+2Hhfac \qquad (3)$$

for example, under conditions similar to the chemical reaction (1−) described in Example 4. All steps occur in a chamber with no pumping (static conditions) so that no copper is lost from the system.

EXAMPLE 6

Copper is redistributed from a wafer surface into recesses on the wafer by volatizing surface copper and maintaining a high concentration of gas phase copper precursor that diffuses into recesses and preferentially accretes therein. An etching agent, such as Hhfac or $Cu(hfac)_2$ and tmvs, is flowed above the wafer so that removal of copper at the surface and near the surface occurs. Copper removal and escape from deep recesses occurs to a lesser extent, since gas phase copper generated within the feature has a relatively large chance of striking and adhering back to the inner surfaces of the feature. Copper removal from recesses may also occur to a lesser extent because the etching conditions will be such that a minimum amount of etchants will be used, which will be just enough to saturate the top surfaces.

The gas phase above the wafer surface is maintained in a higher concentration (for example, at least doubled) of copper precursor through the use of a confining source 50, such as an opposing copper plate or a wafer with a thick copper film adjacent, i.e., in close proximity (less than about 1 cm) to the wafer 14, as shown in FIG. 1. This limits escape of copper in the gas phase, as well as serving as an additional copper source.

Copper of the gas phase diffuses into recesses, and has a higher probability of adding to film thickness there than on the upper surface because of the relatively higher ratio of nucleation and growth sites in enclosed gaseous volume. The chamber (not shown) and opposing copper plate 50 may be kept at the higher temperature (for example, about 20–100° C. higher) than the product wafer 14 to enhance film growth. The higher temperature opposing copper plate 50 reacts with the etchants and contributes to the production of a higher amount of copper precursors. Copper redistribution is achieved at low cost in this embodiment since a conventional showerhead is not required.

It should be understood that the embodiments of the present invention shown and described in the specification are only preferred embodiments of the inventors who are skilled in the art and are not limiting in any way. Therefore, various changes, modifications or alterations to these embodiments may be made or resorted to without departing from the spirit of the invention and the scope of the following claims.

What is claimed is:

1. A method to redistribute deposited solid copper on a topography of a wafer in a reaction chamber, comprising the steps of:

solubilizing said deposited copper in a fluid under solubilizing-promoting conditions in said reaction chamber;

transporting said solubilized copper to a different portion of said topography; and redepositing said copper on said different portion of said topography.

2. The method of claim 1 wherein the fluid is a gas or a liquid.

3. The method of claim 1 wherein said solubilizing, transporting and redepositing are repeated a plurality of times to obtain a desired redistribution of said copper on the topography.

4. The method of claim 1 wherein said redepositing occurs by altering a condition in said reaction chamber.

5. The method of claim 1 wherein said solubilizing occurs by submitting said deposited copper to a mixture of gases to form volatile copper compounds at a surface of said topography, and said transporting occurs by gaseous vectors.

6. The method of claim 5 wherein said mixture of gases includes $Cu^{2+}$ $(hfac)_2$ and tmvs.

7. The method of claim 5 wherein said mixture of gases includes Hhfac and tmvs.

8. The method of claim 5 wherein said mixture of gases includes Hhfac, and said deposited copper includes copper oxide.

9. The method of claim 8 wherein said redepositing occurs by introducing hydrogen gas into the reaction chamber to reduce said volatile copper compounds.

10. The method of claim 8 wherein said redepositing occurs by disproportionation of the formed volatile copper compounds.

11. The method of claim 5 further comprising a confining source above said wafer to maintain a high concentration of volatile copper compounds above said topography.

12. The method of claim 11 wherein said confining source is a copper plate.

13. The method of claim 1 wherein said solubilizing occurs by submitting said deposited copper to a solution to form volatile or liquid copper compounds at a surface of said topography, and said transporting occurs by liquid vectors.

14. The method of claim 13 wherein said solution includes Hhfac and tmvs.

15. The method of claim 13 wherein said wafer is spun and said solution is dispensed onto said spinning wafer to evenly distribute said solution across said topography.

16. The method of claim 13 wherein said volatile or liquid copper compounds are formed by increasing the temperature of said wafer to dissolve said deposited copper in said solution.

17. The method of claim 16 wherein said redepositing occurs by adjusting the temperature of said wafer to decompose said volatile or liquid copper compounds.

18. The method of claim 13 wherein said redepositing is electro-assisted by adding an electric field to said wafer.

19. The method of claim 1 wherein said topography includes a top surface and a feature having opposing side surfaces and a bottom surface, wherein said deposited copper is thicker on said top surface and said feature bottom surface than on said feature side surfaces, and said deposited copper on said top surface and feature bottom surface is solubilized in said fluid and transported to said feature side surfaces and redeposited thereon.

20. The method of claim 19 wherein said deposited copper forms an overhang between said top surface and each of said opposing feature side surfaces, and deposited copper of said overhang is solubilized in said fluid and transported to said feature side surfaces and redeposited thereon.

21. A method to redistribute deposited solid copper on a topography of a wafer, comprising the steps of:
(a) distributing a solution across said topography of said wafer in a deposition reaction chamber to form a liquid film on said topography, said wafer maintained at a temperature where dissolution of said copper in said solution is essentially avoided;
(b) then increasing the temperature of said wafer to dissolve said deposited copper in said solution to form a copper-containing liquid film on said topography; and
(c) thereafter causing said dissolved copper to decompose and redeposit on said wafer.

22. The method of claim 21 wherein said solution comprises Hhfac and tmvs.

23. The method of claim 21 wherein said distributing occurs by spinning said wafer and dispensing said solution on said spinning wafer.

24. The method of claim 21 further comprising applying an electric field to said wafer.

25. The method of claim 21 wherein said dissolved copper is caused to decompose by changing the temperature in said reaction chamber.

26. The method of claim 21 wherein said dissolved copper is caused to decompose by changing the pressure in said reaction chamber.

27. The method of claim 21 further comprising repeating steps (a) through (c) a plurality of times to obtain a desired redistribution of solid copper.

28. A method to redistribute deposited solid copper on a wafer in a deposition reaction chamber, said wafer having a topography comprising both essentially horizontal and essentially vertical surfaces, the method comprising the steps of:
(a) depositing said copper by physical vapor deposition onto said topography to form a nonconformal copper film having a greater thickness on said essentially horizontal surfaces than on said essentially vertical surfaces;
(b) etching at least a portion of said copper from at least one of said essentially horizontal surfaces with Hhfac and tmvs to form 2 Cu(hfac)tmvs; and
(c) redepositing said etched copper on at least one of said essentially vertical surfaces.

29. A method to redistribute deposited solid copper on a wafer in a deposition reaction chamber, said wafer having a topography comprising both essentially horizontal and essentially vertical surfaces, the method comprising the steps of:
(a) depositing said copper by physical vapor deposition onto said topography to form a nonconformal copper film having a greater thickness on said essentially horizontal surfaces than on said essentially vertical surfaces;
(b) etching at least a portion of said copper from at least one of said essentially horizontal surfaces with $Cu(hfac)_2$ and tmvs to form 2 Cu(hfac)tmvs; and
(c) redepositing said etched copper on at least one of said essentially vertical surfaces.

30. The method of claim 29 wherein said redeposition occurs by stopping the flow of $Cu(hfac)_2$ and tmvs to allow for the disproportionation of Cu(hfac)tmvs to occur.

31. A method to redistribute deposited solid copper on a wafer in a deposition reaction chamber, said wafer having a topography comprising both essentially horizontal and essentially vertical surfaces, the method comprising the steps of:
(a) depositing said copper by physical vapor deposition onto said topography to form a nonconformal copper film having a greater thickness on said essentially horizontal surfaces than on said essentially vertical surfaces;
(b) oxidizing said copper deposited on said essentially horizontal surfaces then etching at least a portion of said copper from at least one of said essentially horizontal surfaces with Hhfac to form $2Cu^{+2}(hfac)_2$; and
(c) redepositing said etched copper on a least one of said essentially vertical surfaces.

32. The method of claim 31 wherein said redepositing occurs by hydrogen reduction of said 2 $Cu^{12}(hfac)_2$.

33. A method to redistribute deposited solid copper on a wafer in a deposition reaction chamber, said wafer having a topography comprising both essentially horizontal and essentially vertical surfaces, the method comprising the steps of:
(a) depositing said copper by physical vapor deposition onto said topography to form a nonconformal copper film having a greater thickness on said essentially horizontal surfaces than on said essentially vertical surfaces;
(b) etching at least a portion of said copper from at least one of said essentially horizontal surfaces by flowing an etching agent above said wafer to volatilize said deposited copper; and (c) redepositing said etched copper on at least one of said essentially vertical surfaces by stopping the flow of etching agent.

34. A method of redistributing copper deposited on a wafer surface topography comprising the steps of volatilizing at least a portion of said deposited copper to form a gas phase copper precursor and maintaining a concentration of said gas phase copper precursor for diffusion of copper precursor into said topography until a desired redistribution of copper on said topography is effected.

35. The method of claim 34 wherein said volatilizing occurs by flowing an etching agent above said wafer.

36. The method of claim 35 wherein said etching agent includes hfac and tmvs.

37. The method of claim 34 wherein said concentration of said gas phase copper precursor is maintained by a copper plate positioned opposite said wafer surface.

38. The method of claim 37 wherein a temperature of said plate is higher than a temperature of said wafer.

39. A method for achieving even distribution of copper on a wafer topography having a nonconformal copper film thereon of relatively thick and thin regions, comprising the steps of distributing a copper-containing solution across said wafer topography to form a homogeneous liquid film on said topography, and thereafter causing said copper from said copper-containing solution to deposit on said topography at said relatively thin regions of said copper film.

40. The method of claim 39 further comprising causing copper film in said relatively thick regions to dissolve into said copper-containing solution and thereafter causing said dissolved copper and said copper from said copper-containing solution to deposit from said solution onto said wafer topography at said relatively thin regions of said copper film.

41. The method of claim 40 wherein said copper film is caused to dissolve by increasing the temperature of said wafer.

42. The method of claim 39 wherein said copper is caused to deposit by changing the temperature within a reaction chamber containing said wafer.

43. The method of claim 39 wherein said copper is caused to deposit by changing the pressure within a reaction chamber containing said wafer.

* * * * *

UNITED STATES PATENT AND TRADEMARK OFFICE
CERTIFICATE OF CORRECTION

PATENT NO. : 6,730,605 B2  Page 1 of 1
DATED : May 4, 2004
INVENTOR(S) : Arena-Foster et al.

It is certified that error appears in the above-identified patent and that said Letters Patent is hereby corrected as shown below:

<u>Title page,</u>
Item [*] Notice, delete the phrase "by 487" and insert -- by 369 days --

Signed and Sealed this

Tenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,730,605 B2
DATED : May 4, 2004
INVENTOR(S) : Arena-Foster et al.

Page 1 of 1

It is certified that error appears in the above-identified patent and that said Letters Patent is hereby corrected as shown below:

Column 5,
Line 23, reads "...bottom of the features, and mainly most $Cu^{2-}(hfac)_2$ reacts...." and should read -- ... bottom of the features, and mainly most $Cu^{2+}(hfac)_2$ reacts.... --.

Column 8,
Line 53, reads "...occurs by hydrogen reduction of said 2 $Cu^{12}(hfac)_2$." and should read -- ...occurs by hydrogen reduction of said 2 $Cu^{+2}(hfac)_2$. --.

Signed and Sealed this

Twenty-sixth Day of July, 2005

JON W. DUDAS
*Director of the United States Patent and Trademark Office*